United States Patent
Lee

(10) Patent No.: US 7,441,056 B2
(45) Date of Patent: Oct. 21, 2008

(54) MEMORY DEVICE CAPABLE OF COMMUNICATING WITH HOST AT DIFFERENT SPEEDS, AND DATA COMMUNICATION SYSTEM USING THE MEMORY DEVICE

(75) Inventor: Kee-Hoon Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 224 days.

(21) Appl. No.: 11/433,367

(22) Filed: May 12, 2006

(65) Prior Publication Data

US 2006/0288131 A1    Dec. 21, 2006

(30) Foreign Application Priority Data

May 27, 2005    (KR) .................. 10-2005-0045211

(51) Int. Cl.
*G06F 3/00*    (2006.01)
*G06F 13/00*    (2006.01)
(52) U.S. Cl. .................. 710/62; 710/8; 710/9; 710/10
(58) Field of Classification Search .............. 710/8–10, 710/62

See application file for complete search history.

(56) References Cited

U.S. PATENT DOCUMENTS

| | | | |
|---|---|---|---|
| 5,889,721 A | 3/1999 | Gannage | 365/226 |
| 6,052,738 A | 4/2000 | Muller et al. | 709/250 |
| 6,119,196 A | 9/2000 | Muller et al. | 710/243 |
| 6,317,352 B1 | 11/2001 | Halbert et al. | 365/52 |
| 6,707,818 B1 * | 3/2004 | Kadambi et al. | 370/391 |

FOREIGN PATENT DOCUMENTS

WO    WO 2004/008773    1/2004

* cited by examiner

*Primary Examiner*—Tammara R Peyton
(74) *Attorney, Agent, or Firm*—F. Chau & Associates, LLC

(57) ABSTRACT

Provided is a memory device for high speed communication including a low speed data communication port and a low speed data input/output circuit, and a data communication system using the memory device. The memory device includes a high speed port interface for transmitting or receiving data to or from a host at a high speed, and a low speed port interface for transmitting or receiving data to or from the host at a low speed.

16 Claims, 2 Drawing Sheets

MEMORY DEVICE CAPABLE OF COMMUNICATING WITH HOST AT DIFFERENT SPEEDS, AND DATA COMMUNICATION SYSTEM USING THE MEMORY DEVICE

CROSS-REFERENCE TO RELATED PATENT APPLICATIONS

This application claims priority to Korean Patent Application No. 2005-0045211, filed on May 27, 2005, in the Korean Intellectual Property Office, the disclosure of which is incorporated by reference herein.

BACKGROUND OF THE INVENTION

1. Field of the Invention

The present invention relates to a memory device, and more particularly, to a memory device capable of communicating with hosts at different speeds, and a data communication system using the memory device.

2. Description of the Related Art

Due to the diversification in application environments of memory devices, and the increasing capacity and speed of memory devices, the data transmission speed and data throughput between hosts, such as memory controllers, and memory devices, continues to increase as well. With increased transmission speed and data throughput rates, it becomes more challenging to ensure the signal integrity of data transmitted and received to and from these memory devices.

In data communication, since data reception and transmission speed influences the topology of connecting hosts with memory devices, a limitation exists in the number of Dual In line Memory Modules (DIMMS) which each channel can support in a system requiring a high capacity memory. In order to remove the limitation, a FB (Fully Buffered)-DIMM structure is adopted.

FIG. 1 is a block diagram of a conventional memory device 100 including a high speed port interface (HSP I/F) 110.

Referring to FIG. 1, the memory device 100 includes a high speed port interface (HSP I/F) 110, a high speed data communication block 120, an operation setting block 130, and a control logic 140.

The high speed port interface 110 includes a high speed port 111 and a high speed data input/output circuit 112 to perform an interface function of communicating with a host at a high speed. The high speed port 111 is a pin of the memory device 100, and the high speed data input/output circuit 112 performs data synchronization between the host and the high speed data communication block 120.

The high speed data communication block 120 is used for high speed data communication, and includes functional blocks 121, a data interface 122, and a memory cell 123.

The operation setting block 130 includes a Phased Locked Loop (PLL) 131, a temperature sensor 132, and a status register 133, to control the operation of the memory device 100,.

The control logic 140 controls the operations of the high speed data communication block 120 and the operation setting block 130. Data can be input to or output from the control logic 140 directly through the high speed port interface 110 or through the high speed port interface 110 and the functional blocks 121.

A memory device for FB-DIMM includes a buffer. In FIG. 1, the high speed port interface 110 corresponds to a buffer. Control signals and data signals used for data communication between a host and the memory device 100 are received or transferred through the buffer 110. In order to improve the performance of a system with a FB-DIMM structure, it is necessary to increase the data reception/transmission speed between the host and the buffer 110, between the buffer 110 and the high speed data communication block 120, and between the control logic 140 and both the high speed data communication block 120 and the operation setting block 130 of the memory device 100.

However, control signals and data signals do not necessarily need to travel at high speeds between the memory device 100 and the host. For example, when data having information regarding operation setting conditions of the memory device 100 is written to or read from a predetermined area of the operation setting block 130 of the memory device 100, the accuracy of the data is more important than the speed at which the data is written or read.

The information regarding the operation setting conditions of the memory device 100 may include operation mode, temperature sensor status, and error flags. Information regarding operation setting conditions of a memory device is essential for memory devices engaged in high speed data communication.

The high speed data communication block 120 includes a plurality of functional blocks for interfacing. For example, the high speed data communication block 120 includes interface functional blocks corresponding to the number of signal lines required for high speed data communication, and interface functional blocks required for receiving or transmitting data from or to the operation setting block 130.

The high speed port interface 110 interfaces with the high speed data communication block 120. This means that there is a dedicated interface for handling the input and output of high speed communications. However, such a dedicated interface occupies a large area on a circuit and can often have a high rate of power consumption. Therefore, it is inefficient in terms of layout size and power consumption to use an interface dedicated to high speed communications to write or read information that does not require high speed communication.

SUMMARY OF THE INVENTION

According to an exemplary embodiment of the present invention, there is provided a memory device which includes a high speed port interface and a low speed port interface. The high speed port interface transmits and receives data to and from a host at a high speed, while the low speed port interface transmits and receives data to and from the host at a low speed.

According to another exemplary embodiment of the present invention, there is provided a data communication system which includes a memory device, and a memory controller. The memory controller transmits and receives data to and from the memory device at two or more different speeds.

BRIEF DESCRIPTION OF THE DRAWINGS

The above and other features of the present invention will become more apparent by describing in detail exemplary embodiments thereof with reference to the attached drawings in which.

DETAILED DESCRIPTION OF EXAMPLARY EMBODIMENTS

Figure 1:
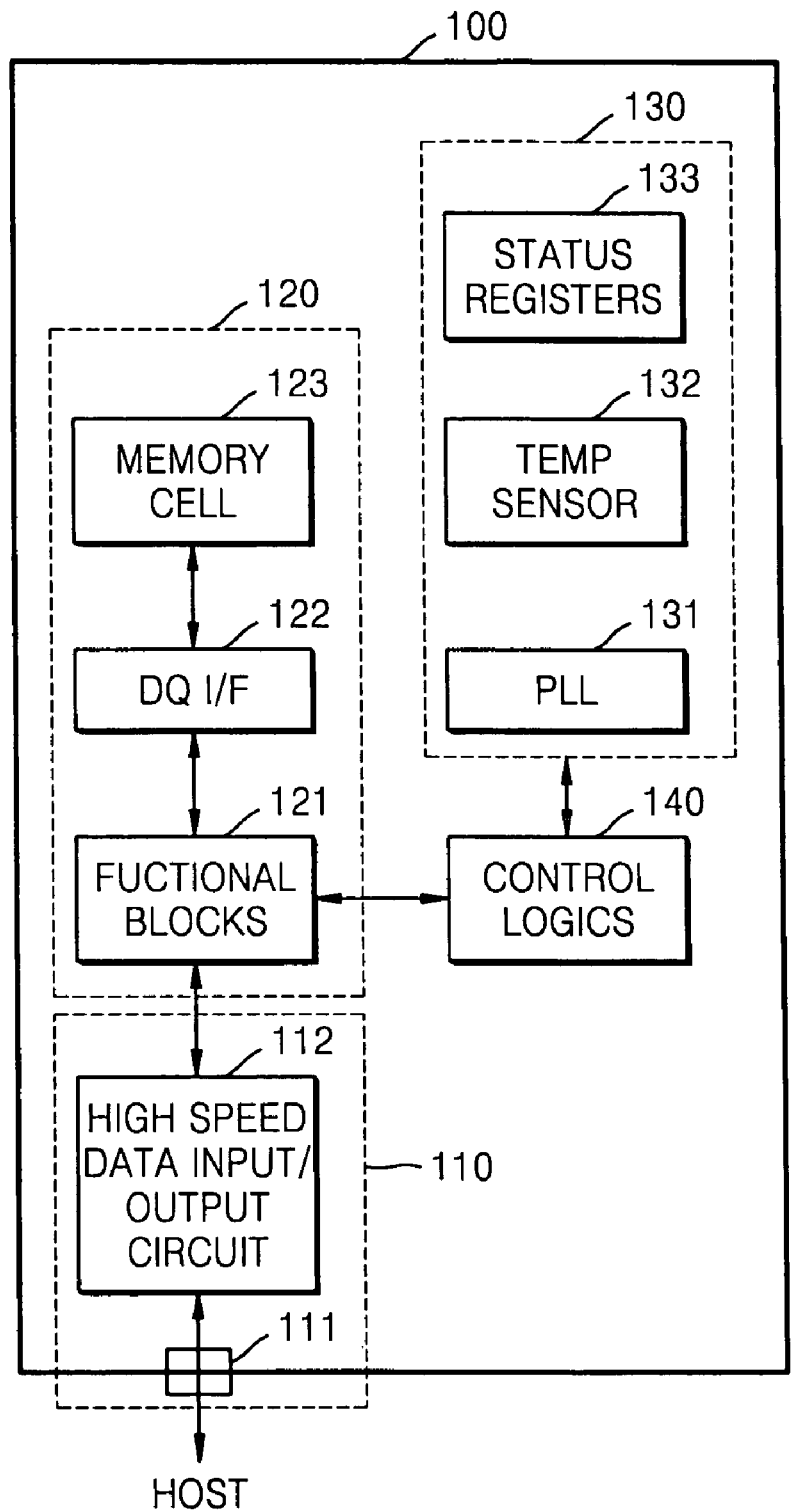
FIG. 1 is a block diagram of a conventional memory device including a high speed port interface.

Hereinafter, the present invention will be described in detail with reference to the accompanying drawings. Like reference numerals in the drawings denote like elements, and thus their descriptions will not be repeated.

An exemplary embodiment of the present invention provides a memory device which includes a high speed data communication port, a low speed data communication port, and a low speed data input/output circuit connected to the low speed data communication port.

The low speed data communication port can receive information from external hosts on operation mode, temperature sensors t, error flags, etc.

Figure 2:
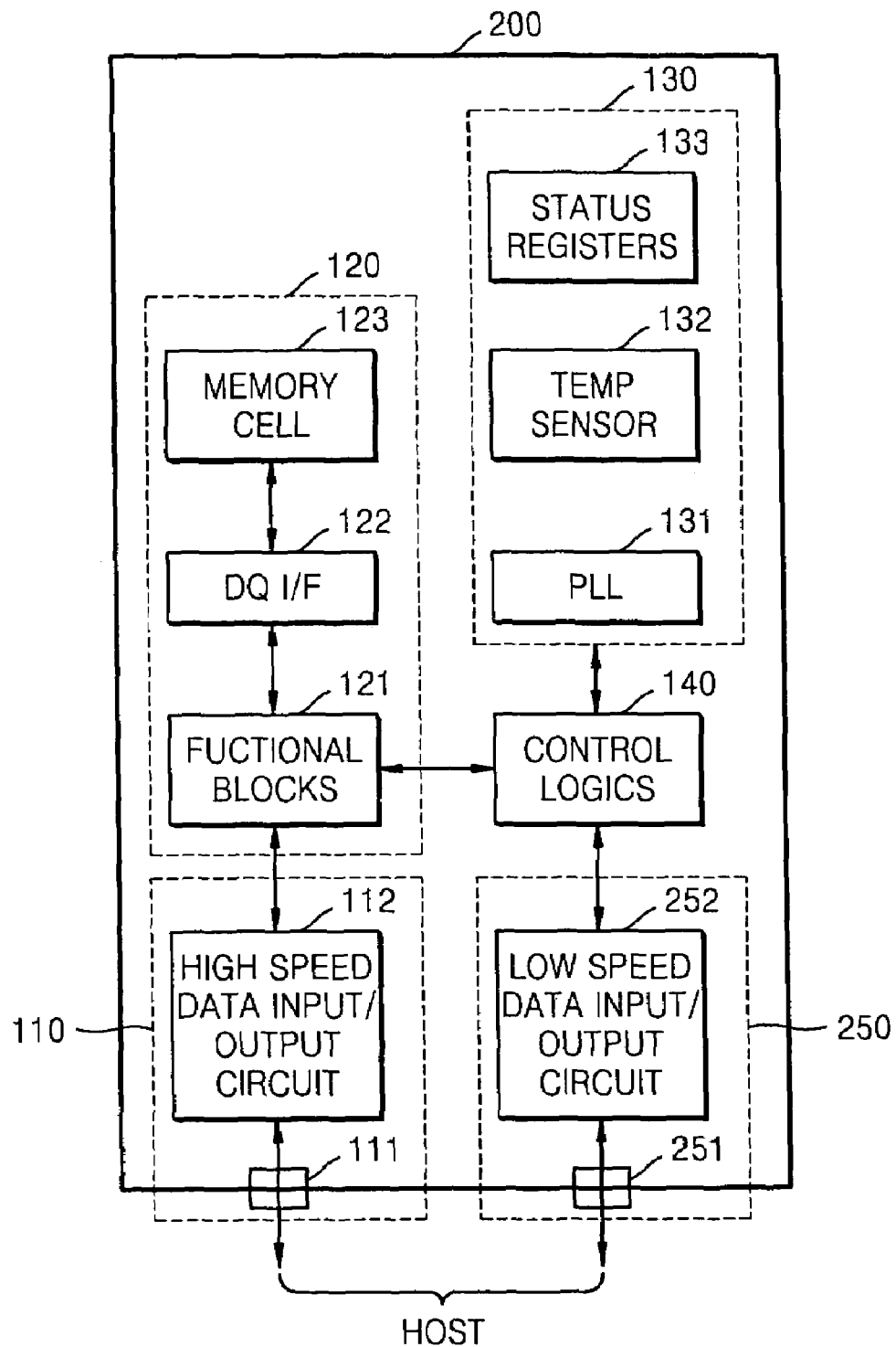
FIG. 2 is a block diagram of a memory device including a low speed port interface according to an exemplary embodiment of the present invention.

FIG. 2 is a block diagram of a memory device 200 which includes a high speed port interface (HSP I/F) 110, a high speed data communication block 120, a low speed data communication block 130, a control logic 140, and a low speed port interface (LSP I/F) 250 according to an exemplary embodiment of the invention.

The high speed port interface 110 includes a high speed port 111 and a high speed data input/output circuit 112. The high speed port 111 is a pin of the memory device 200. The high speed data input/output circuit 112 is connected to the high speed port 111 and interfaces data between a host and the high speed data communication block 120.

The high speed data communication block 120 includes functional blocks 121, a data interface 122, and a memory cell 123. The functional blocks 121 are used to perform coding, decoding, conversion of parallel data into serial data, conversion of serial data into parallel data, etc. The data interface 122 connects the memory cells 123 with the functional blocks 121. The memory cell 123 is used to input, store, and output information used for data communication.

The low speed data communication block 130 includes a Phase Locked Loop (PLL) 131, a temperature sensor 132, and a status register 133. The temperature sensor 132 outputs temperature sensor information of the memory device 200. The status register 133 outputs operation mode setting information, error flag information of received or transmitted data, etc.

The control logic 140 controls the operations of the high speed data communication block 120 and the low speed data communication block 130.

The low speed port interface (LSP I/F) 250 includes a low speed port 251 and a low speed data input/output circuit 252. The low speed port 251 is a pin of the memory device 200. The low speed data input/output circuit 252 is connected to the low speed port 251 and interfaces data between the host and the low speed data communication block 130. Low speed data can be input to or output from the low speed data communication block 130 via the control circuit 140.

Data which includes information on operation mode of the memory device 200, temperature sensors, and error flag information of received or transmitted data, are received or transmitted between the low speed data communication block 130 and the host. Errorless reception and transmission of such data is more important than the speed at which the data travels. Since a probability of generating errors in data received or transmitted is higher in high speed data communication, an exemplary embodiment of the present invention makes it possible to increase the accuracy of data reception and transmission and significantly reduce the probability of error generation.

Although not shown in the drawings, a data communication system including a host for data communication can be easily implemented by utilizing the memory device 200 according to an exemplary embodiment of the present invention. The host may include control units, such as a CPU, a memory controller, etc., for performing predetermined operations through a memory device. The host may further include ports corresponding to the low speed port 251 and the high speed port 111 of the memory device 200 for performing high speed and low speed data communication with the memory device. If two or more hosts perform high speed and low speed data communication with the memory device 200 according to an exemplary embodiment of the present invention, each host may include at least one corresponding port.

An exemplary embodiment of the invention relates to a data communication memory device having two different speeds, a high speed and a low speed, however, the present invention can be also applied to data communication memory devices having a plurality of different speeds.

A memory device according to an exemplary embodiment of the present invention can perform high speed data communication through a high speed data communication interface, and can receive or transmit data at a low speed, where accuracy is preferred over speed through a low speed data communication interface.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A memory device comprising:
    a high speed port interface exchanging data with a host at a high speed;
    a high speed data communication block exchanging high speed data with the host through the high speed port interface;
    a low speed port interface exchanging low speed data with the host at a low speed;
    a low speed data communication block maintaining operating setting conditions of the memory device and exchanging low speed data with the host through the low speed port interface; and
    control logic controlling the operations of the high speed data communication block and the low speed data communication block,
    wherein the control logic enables the high speed communication block to exchange the high speed data with the host through the high speed port interface and enables the low speed communication block to exchange the operating setting conditions of the memory device through the low speed interface.

2. The memory device of claim 1, wherein the high speed data communication block comprises:
    a functional block transmitting or receiving data and performing a predetermined operation using the data;
    a memory cell; and
    a data interface between the memory cell and the functional block.

3. The memory device of claim 2, wherein the predetermined operation is one of coding, decoding, conversion of parallel data into serial data, and conversion of serial data into parallel data.

4. The memory device of claim 1, wherein the low speed data communication block processes at least one of the group comprising: information of operation mode of the memory device, temperature sensor information, and error flag information of received or transmitted data.

5. The memory device of claim 4, wherein the low speed data communication block comprises:
a phase locked loop (PLL);
a status register outputting the operation mode of the memory device and the error flag information of received or transmitted data; and
a temperature sensor outputting the temperature sensor information.

6. The memory device of claim 1, wherein the high speed port interface comprises:
a high speed port; and
a high speed data input/output circuit connected to the high speed port, and performing data synchronization between the host and the high speed data communication block.

7. The memory device of claim 1, wherein the low speed port interface comprises:
a low speed port; and
a low speed data input/output circuit connected to the low speed port, and performing data synchronization between the host and the low speed data communication block.

8. The memory device of claim 1, wherein the memory device is configured to interface with a plurality of hosts.

9. A data communication system comprising:
a memory device;
a memory controller exchanging data with the memory device at different speeds; and
a pair of high speed port interfaces to exchange data with the memory controller at a high speed;
a high speed data communication block exchanging high speed data with the memory controller through the high speed port interfaces;
a pair of low speed port interfaces exchanging data with the memory controller at a low speed;
a low speed data communication block maintaining operating setting conditions of the memory device and exchanging low speed data with the memory controller through the low speed port interfaces;
control logic controlling the operations of the high speed data communication block and the low speed data communication block,
wherein the control logic enables the high speed communication block to exchange high speed data with the memory controller through the high speed port interfaces and enables the low speed communication block to exchange the operating setting conditions of the memory device with the memory controller through the low speed interfaces.

10. The data communication system of claim 9, wherein the low speed port interfaces are electrically connected to one another and the high speed port interfaces are electrically connected to one another.

11. The data communication system of claim 9, wherein the high speed data communication block comprises:
a functional block transmitting and receiving data and performing a predetermined operation using the data;
a memory cell; and
a data interface between the memory cell and the functional block.

12. The data communication system of claim 11, wherein the predetermined operation is one of coding, decoding, conversion of parallel data into serial data, and conversion of serial data into parallel data.

13. The data communication system of claim 9, wherein the low speed data communication block processes at least one of the group comprising: information of operation mode of the memory device, temperature sensor information, and error flag information of received or transmitted data.

14. The data communication system of claim 9, wherein the low speed data communication block comprises:
a phase locked loop (PLL);
a status register outputting the operation mode of the memory device and the error flag information of received or transmitted data; and
a temperature sensor outputting the temperature sensor information.

15. The data communication system of claim 9, wherein the first high speed port interface comprises:
a high speed port; and
a first high speed data input/output circuit connected to the high speed port and performing data synchronization between the host and the high speed data communication block.

16. The data communication system of claim 9, wherein the first low speed port interface comprises:
a low speed port; and
a first low speed data input/output circuit connected to the low speed port and performing data synchronization between the host and the low speed data communication block.

* * * * *